Aug. 1, 1961 E. M. JONES 2,994,834

TRANSISTOR AMPLIFIERS

Filed Feb. 29, 1956

INVENTOR

EDWARD M. JONES

BY William H. Breunig

AGENT

United States Patent Office 2,994,834
Patented Aug. 1, 1961

2,994,834

TRANSISTOR AMPLIFIERS

Edward M. Jones, Cincinnati, Ohio, assignor to The Baldwin Piano Company, Cincinnati, Ohio, a corporation of Ohio Filed Feb. 29, 1956, Ser. No. 568,635
15 Claims. (Cl. 330—39)

The present invention relates to junction transistors, and to transistor amplifiers.

The modest gain of the junction transistor has led to numerous attempts at grouping such transistors in order to develop adequate total gain from a small available input signal. In one aspect, the present invention provides a novel junction transistor circuit in which the number of stages may be as great as is required by the amplifier requirements.

In another aspect, the present invention has as an object the realization of cathode-follower properties in the application of junction transistors. Cathode-followers in the field of vacuum tubes are noted for the several related properties of having extremely high input impedance and very low output impedance, so that the signal-current drain imposed by the amplifier on the signal source is low, yet the amplifier is capable of driving loads whose impedance is quite low and whose current drain is considerable, bearing in mind that a load is a power consuming device. The cathode-follower in vacuum tube practice has the further characteristic of producing almost 1-to-1 ratio of voltage of output signal to input signal. Accordingly, another object of the present invention is to provide a novel form of transistor amplifier giving greater realization of cathode-follower characteristics in junction transistor circuits than has heretofore been available.

It is obvious that, in a power amplifier, or in a current amplifier, where a series of stages are cascaded with each stage energizing the next, that the successive stages will be required to carry progressively heavier currents. In accordance with the present invention, a cascaded junction transistor amplifier is provided wherein the size of the transistors may be readily related to the current requirements of the stage in the amplifier in which such transistors are cascaded. A feature of the invention is a circuit in which cascaded transistors have common collector connections, as a result of which it becomes possible to fabricate plural junction transistors on a single specimen of N-P-N or P-N-P multiple-junction material. In such a system, the iput junction transistor may be fabricated of a small subdivision of a total area of a multiple junction semi-conductor body, and successive elements in the cascaded series of amplifiers may be formed of proportionally larger areas of the multiple-junction device. Moreover, the direct current supply may be taken from rectifier junctions integral with the same specimen, so as to constitute a compact, self-contained device incorporating both amplifier and power supply within a single unit, suitable for sealing in a heat-dissipating container. Advantageously, the amplifier is relatively insensitive to power supply variation and ripple.

The illustrative embodiment of the invention will be seen to employ two sequences of transistors, where each sequence is of the same number of transistor units as are found in the other sequence, and where each transistor unit in the sequence has a corresponding transistor in the other, the pair constituting one stage of amplification, and the transistors of each pair having complementary symmetry to the other. The collectors of all of the transistor units in each sequence are connected together, the bases of each pair of transistor units (one from each sequence) are connected together, and the emitters of each pair of transistor units are connected together. The common connection of the bases of the input pair of transistor units constitutes an input terminal; the common connection of the emitters of the output pair of transistors constitutes an output connection; and the cascaded stages have the common emitters of any preceding stage connected to the common connection of the bases of the next following stage. It is seen, therefore, that the base-emitter junctions of the paired stages are connected in sequence between the input terminal and the output terminal. These junctions are connected in parallel, as to any one stage, and they exhibit complementary symmetry. It has been previously noted that the novel amplifier has virtually all of the properties of the cathode-follower known in vacuum tube practice; and, in operation, there will also be seen to be a limited parallel between the present amplifier and the so called distributed amplifier known in vacuum tube practice.

The foregoing prominent characteristics and features of the illustrative amplifier, disclosed in further detail below, is not to be construed as limiting the invention. Those skilled in the art will readily find numerous variations and modifications readily practicable. In the detailed description of various embodiments of the invention that follows, reference is made to the accompanying drawings, wherein.

Figure 1:
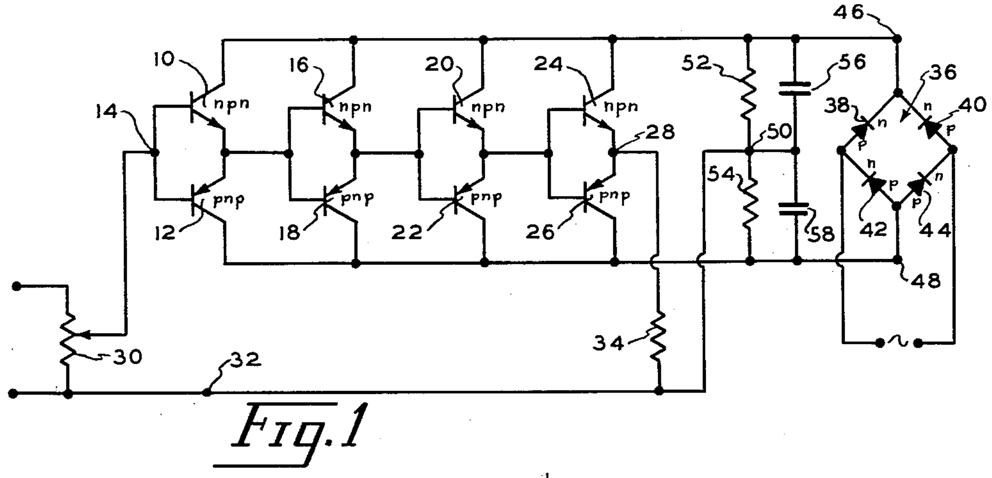
FIGURE 1 is the wiring diagram of one form of the cascaded transistor circuit embodying features of the invention.

Referring now to FIGURE 1 there is seen a cascaded amplifier including four pairs of junction transistors cascaded. The first pair of transistors 10 and 12 are of complementary symmetry and are of smallest size in the sequence. Junction transistor 10 is of the N-P-N type, whereas transistor 12 is of the P-N-P type. The bases of these transistors have a common connection 14 which constitutes an input terminal, and the emitters of transistors 10 and 12 also have a common connection. Three additional pairs of transistors of complementary symmetry are included in the amplifier, i.e. 16 and 18, 20 and 22, and 24 and 26. Junction transistors 10, 16, 20 and 24 form a sequence of N-P-N junction transistors, whereas transistors 12, 18, 22 and 26 form a second sequence of P-N-P junction transistors; and each of the transistors from the input pair to the output pair are of progressively greater size, in proportion to the current requirements of the novel circuit. Each pair of transistors is seen to have a common connection to the bases, which is connected to the emitters of the preceding pair of transistors. The emitters of the output pair of transistors 24 and 26 are also connected together, and this common connection 28 constitutes an output terminal.

An input signal source represented by the potentiometer 30 has its input impressed between input terminal 14 and a connection 32; and the load 34 driven by the amplifier is connected between output terminal 28 and the common connection 32 between the input and the output circuits. These are seen to be connected in series, in a sense, between input terminal 14 and output terminal 28.

A biasing supply for the amplifier is represented by the bridge of rectifiers 36, these rectifiers including a pair of rectifiers 38 and 40 which have the N-terminals thereof connected to the collectors of the N-P-N sequence of junction transistors 10, 16, 20 and 24; and a further pair of junction rectifiers 42 and 44 which have the P-terminals thereof connected to the collectors of the sequence of P-N-P junction transistors 12, 18, 22 and 26. Terminals 46 and 48 of bridge 36 are of opposite polarity, and a mid point 50 in the output of the bridge rectifier is established by a resistance voltage divider including portions 52 and 54 which establishes terminal 50 under static conditions; and a pair of filter capacitors 56 and 58 in parallel with resistors 52 and 54, respectively, maintain terminals 46 and 48 at substantially constant potential irrespective of signal variations in the cascade of paired transistor stages previously described.

It has been noted that each transistor of a stage has a corresponding transistor exhibiting complementary symmetry connected to it both at its base and at its emitter. Under static conditions, if one regards stage 24, 26, it will be appreciated that the collector current of unit 24 emerges at the emitter of transistor unit 24, and that this is the same current as is drawn by the collector and emitter of unit 26. Terminal 28 is therefore at the same potential as the center tap 50 of the bias supply 36, 52, 54, 56, and 58. The input stage 10 and 12, having a similar condition of complementary symmetry has the collector current drawn by transistor 10 equalled and balanced by the collector current of transistor 12 so that terminal 14 of the input circuit is at the same potential as center tap 50 of the bias supply. This same balanced condition applies throughout, with ideally balanced transistors in the several stages. While strict balance is by no means essential to satisfactory performance of the system, it will be appreciated that if improved balance were to be desired, appropriate resistors may be included in the circuit for this purpose.

When signal voltage appears across input circuit 30, one of the transistors 10 or 12 may provide an increase of emitter current, while its companion transistor provides decreased current. If it is assumed that a positive signal excursion is occurring, the base-emitter current of transistor unit 10 will increase and that of transistor unit 12 will diminish, the changed current in the two transistors representing an increase in the amount of current which the base-emitter junction of transistor 16 is required to carry. This in turn imposes a heavier current on the base-emitter junctions of the other N-P-N transistors 20 and 24. At the same time the base-emitter junctions of transistors 18, 22 and 26 all diminish. When the signal requires a heavier current to be carried by the P-N junction of the base and emitter in transistor unit 10, the minority carriers represented by this current induce a heavy collector flow, tending to cause recombination of these minority carriers, which is reflected at the base-emitter junction of transistor 16. Here occurs amplification of the current transmitted to the next following stage by the collector-current increase in transistor 16. The progressive amplification continues in transistors 20 and 24. By a similar process, the collector currents in the other sequence of transistors 12, 18, 22 and 26 all diminish.

The unbalanced currents that appear at the emitters of final transistor stage 24 and 26 is a current that is carried by load 34. The fact that load 34 carries a very heavy current, whereas a very light current passes through the input circuit 30 represents the current amplification found in cathode followers; and correspondingly, because the input voltage and the output voltage are very similar in magnitude (a slight loss occurring in the cascade of amplifier stages) the impedance of the input circuit is vastly greater than that of the load.

It has been noted that the present cascaded amplifier possesses some of the characteristics of the distributed amplifier. This will be seen when it is realized that the current unbalance in the input stage 10, 12 is a current which actually reaches load 34; and similarly the unbalanced current of stage 16 and 18 is carried by load 34 as is also true of stage 20 and 22. The load current is a composite made up of the signal variations in the final stage in which there is included the signal current variations in all of the preceding stages.

To provide an indication of the scale of values which may be encountered, a typical example may be of interest. With D.-C. voltage of 150 v. at terminals 46 and 48, to which the collectors of the amplifier are connected, as little as 3.6 watts may be drawn. With a peak-to-peak input signal of 135 volts, and of less than 10 milliwatts, an output of approximately 70 watts is available in load 34. Typically, this may be a loud speaker of only 32 ohms impedance, whereas the input impedance to the first transistor is, in this example, of the order of 5 megohms.

Figures 2, 3:
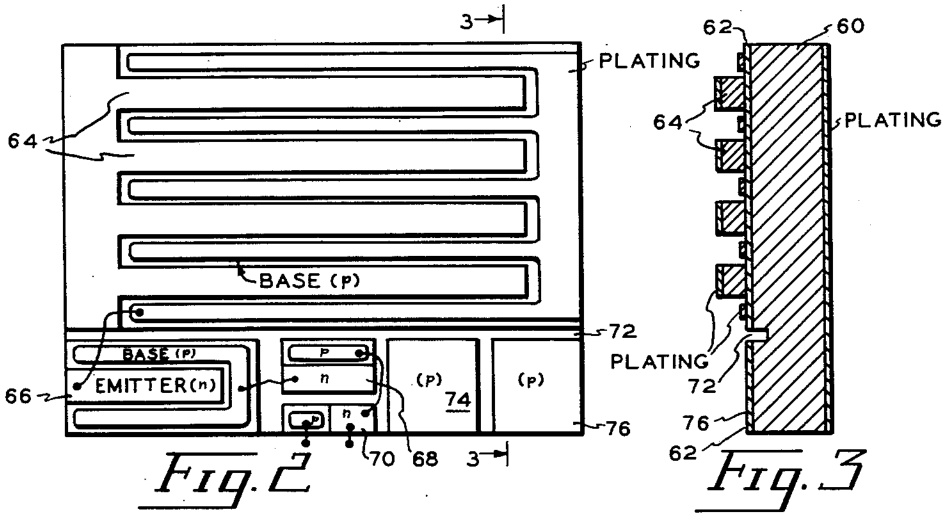
FIGURE 2 is a plan view of a composite transistor and rectifier useful in the amplifier of FIGURE 1.
FIGURE 3 is a cross section of the unit in FIGURE 2 along the line 3—3 therein.

An audio amplifier incorporating the foregoing components may be fabricated using a transistor of the form illustrated in FIGURES 2 and 3, one such unit embodying all of the transistors 10, 16, 20 and 24 of one sequence, plus junction rectifiers 38 and 40; and a second such unit, of complementary symmetry, embodying the transistors 12, 18, 24 and 26, plus junction rectifiers 42 and 44. If it is considered that the illustrated unit is to furnish the components 10, 16, 20, 24, 38 and 40, a slab of semiconductor material 60, such as germanium or silicon appropriately treated for proper performance as the semiconductor of a transistor, will have formed thereon a P-type layer 62 which will, in turn, have areas 64, 76, 68 and 70 formed thereon, so as to produce an N-P junction. The slab 60 embodies the collector terminals of the transistors 10, 16, 20 and 24, and it embodies the N-terminals of rectifiers 38 and 40. Layer 62, which is to be divided as indicated by channel 72, forms a P-N junction to slab 60, so as to produce the rectifying junction of base-to-collector in each of this group of transistors, as well as the P-N junction rectifier pair 38 and 40. Areas 64, 66, 68 and 70 are smaller than the base areas to which they are joined in order to permit adequate ohmic connection to be made to the bases, as indicated by the platings shown in heavy lines, which platings also form the ohmic connections to the slab 60 and to the several emitters. Ohmic connections 74 and 76, formed on portions of layer 62 divided from the remainder of layer 62 by groove 72, form the alternating current terminals of rectifiers 38 and 40 of FIGURE 1. Connections or terminals 74, 76 are proportioned so that each, in its forward-conducting sense, is capable of carrying half the average current of all the connected collectors combined, under load.

A composite transistor and rectifier unit like FIGURE 2, but formed with semi-conductor portions of the opposite conductvity types to that indicated in FIGURE 2, may be utilized to complete the semi-conductor portions of the circuit in FIGURE 1. Each of these composite semi-conductor structures may be mounted on a heat-dissipating copper plate, and the two units may be enclosed in an oil-filled container, as a self-contained amplifier, complete except for the passive elements involved in the input circuit, the output circuit, and the resistors and capacitors 52, 54, 56, and 58.

The composite transistor structure may be utilized in the circuit of FIGURE 1, in a manner ideally suited to the various areas assigned in the drawing. Thus, the smallest area 70 may serve as the emitter of the smallest transistor, input transistor 10 in its sequence (the emitter of transistor 12 being of equal size). The other transistors in FIGURE 1 are required to be of progressively larger sizes, so that the emitters of transistor units 16, 20 and 24 advantageously are identified with emitters 68, 66, 64, respectively. The proportion of sizes is in direct relation to the required signal currents involved in the cascaded amplifier stages.

Figure 4:
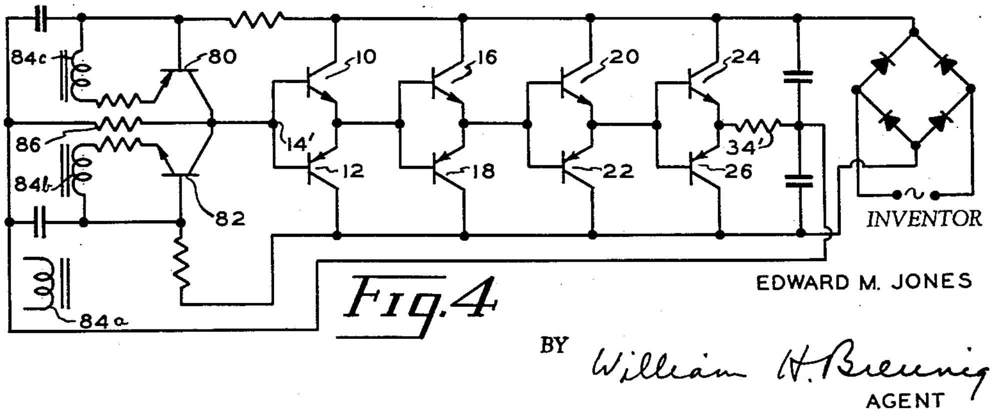
FIGURE 4 is a further modification of the circuit diagram in FIGURE 1.

The circuit of FIGURE 1 is susceptible to a range of variation, and this is true whether the composite transistor structure of FIGURES 2 and 3 is employed, or whether separate transistor units and rectifier units are employed. Thus, for example, the input circuit may be formed of an additional transistor pair 80 and 82, which are junction transistors having complementary symmetry, but which present a low impedance to the input circuit represented by the step up transformer 84a, 84b, and 84c. Resistor 86 provides the collector return circuit for transistors 80 and 82, and the high collector impedance is then presented to the input terminal 14' of the cascaded transistor amplifier stages of FIGURE 4, this input terminal 14' corresponding to input terminal 14 of FIGURE 1. The load impedance 34' in FIGURE 4 corresponds to the load 34 in FIGURE 1; and the other components find duplicates in FIGURE 1, so that no further elaboration of FIGURE 4 need here be provided.

An outstanding property of the foregoing embodiments of the present invention resides in their remarkable insensitivity to power-supply variation and ripple. The relatively crude filter shown is satisfactory for ordinary requirements.

Numerous modifications are intended in the foregoing disclosure, and accordingly the appended claims should be construed broadly and in a manner consistent with the spirit and scope of the disclosure.

What I claim is:

1. A current amplifier, including two sequences of equal numbers of junction transistor units, each sequence being formed on a single semi-conductor body, each of the units in one sequence being paired with a respective complementary unit in the other sequence, each unit having an emitter, a base and a collector, the bases of the input pair of units having a common connection constituting an input terminal, the bases of the remaining pairs of units having respective coupling circuits to the emitters of the next preceding pair of units, said coupling circuits consisting of connections of negligible impedance, and the emitters of the final pair of units constituting an output terminal, and oppositely polarized biasing means for the collectors of the two sequences of units, respectively, said biasing means having a center tap constituting a common input and output terminal, said center tap having a potential mid-way between the potentials of the last named collectors.

2. A current amplifier, including a first and a second sequence of junction transistor units, each sequence being formed on a single semi-conductor body, there being one unit in each sequence paired with a complementary unit in the other sequence, the pairs of units comprising cascaded stages, each unit having an emitter, a base and a collector, a biasing supply having oppositely polarized connections to the collectors of the respective sequences of units and said supply having a center tap having a potential mid-way between the potentials of said oppositely polarized connections, said pairs of units having their respective bases connected together, the connected bases of the first stage of the cascaded stages and the center tap of the bias supply constituting signal input terminals, the emitters of each stage except the last having a coupling circuit to the bases of the next following stage consisting of a connection of negligible impedance, the connected emitters of the last stage and the center tap of the bias supply constituting signal output terminals of the amplifier.

3. A current amplifier, including a first and a second sequence of junction transistor units, there being one unit in each sequence paired with a complementary unit in the other sequence, each unit having an emitter, a collector and a base, the pairs of units comprising cascaded stages, with the emitters of each preceding stage having a coupling circuit to the bases of the next following stage consisting of a connection of negligible impedance, the collectors of the respective sequences being formed on a common semi-conductor body and having oppositely polarized energizing means, and said energizing means having a center tap, an input circuit connected between said center tap and the bases of the input stage, and an output circuit connected between the center tap and the emitters of the output stage.

4. A current amplifier, including an input circuit and an output circuit connected in series and having a common connection, and two sequences of equal numbers of complementary junction transistor units each having an emitter, a base and a collector, means connecting the collectors of the two sequences, the terminals for the base-emitter connections between the units of each sequence being connected in series between the input and output circuits by coupling circuits comprising connections of negligible impedance, and a biasing supply having a center tap connected to the common connection of said input and output circuits, said biasing supply having oppositely polarized connections with respect to said center tap to the collectors of the respective sequences of complementary transistor units.

5. A current amplifier, including an input circuit and an output circuit having a common connection, each of said circuits having a remaining terminal, and a cascade of junction transistor stages, each stage including a pair of junction transistor units having complementary symmetry and each unit having an emitter, a base and a collector, the bases of each stage having a common connection and the emitters of each stage having a common connection, the base-emitter junctions of said stages being series-coupled between said remaining terminals of the input circuit and the output circuit by coupling circuits consisting of connections of negligible impedance, and a biasing supply having a center tap connected to the common connection of the input and output circuits, and said supply having oppositely polarized portions connected to the respective collectors of the pairs of transistor units.

6. A current amplifier, including an input circuit and an output circuit having a common connection, each of said circuits having a remaining terminal, and a cascade of junction transistor stages, each stage including a pair of junction transistor units having complementary symmetry and each unit having an emitter, a base and a collector, the bases of each stage having a common connection and the emitters of each stage having a common connection, the base-emitter connections between said stages being series-coupled between said remaining terminals of the input circuit and the output circuit by coupling circuits consisting of connections of negligible impedance, all the collectors of one transistor unit of each pair being formed of a semiconductor body of one conductivity type and the collectors of the other transistor units being formed of a unitary semiconductor body of the opposite conductivity type, the transistor units of each successive stage in the cascaded stages being of progressively greater sizes.

7. A composite semiconductor assembly including a pair of bodies of semiconductor material, each body having a sequence of transistor units of progressively greater sizes thereon and a pair of junction rectifiers, each of said transistor units having a collector, a base and an emitter, each of said bodies embodying a continuous composite collector and terminal element for a respective sequence of transistor units and junction rectifiers, the composite collector and terminal elements of said bodies being of opposite conductivity types, a subdivided rectifying layer on each said element, the subdivided portions of said layer constituting a pair of rectifier terminals and a sequence of transistor bases, emitters formed on said bases, there being a sequence of complementary pairs of progressively larger transistor units on said bodies, all the pairs except the largest having a common connection from the emitters thereof to the bases of the next larger pair of transistor units in the sequences.

8. A composite semiconductor structure, including a body of semiconductor materials having a subdivided rectifying layer thereon, the parts of said subdivided layer constituting, respectively, a series of progressively larger transistor bases on a unitary composite collector, and each of said bases having emitter junctions thereon, each of the emitter junctions except that on the largest base being connected to the next larger base in the series, and a further pair of rectifying junctions on said composite collector, each rectifying junction being proportioned to carry half of the average current of all the base-collector junctions under load.

9. A current amplifier as including a cascade of junction transistor stages including a first stage and succeeding stages, each of said stages including a pair of junction transistor units of complementary symmetry, each of said transistor units including an emitter, a base and a collector, a common terminal for the bases of each stage, means connecting the emitters of each stage including a low resistance D.C. connection, means coupling the emitters of each stage to the respective bases of each succeeding stage of the cascade consisting of connections of negligible impedance, a source of D.C. supply voltage having respective terminals of alternate polarity connected to collector electrodes of said cascade, means for deriving a point of D.C. voltage mid-way between the voltages of said terminals, a load, means for connecting said load between said point and the emitters of the last stage of said cascade, and an input circuit connected to said first stage of said cascade.

10. The combination in accordance with claim 9 wherein said input circuit for said cascade is connected between the common terminal of said first stage and said point of D.C. voltage.

11. The combination in accordance with claim 9 wherein said input circuit includes a D.C. connection between said common terminal of said first stage and said point of D.C. voltage.

12. The combination in accordance with claim 9 wherein said input circuit includes a pair of further transistors of complementary symmetry, each of said further transistors including a base, an emitter and a collector, the collectors of said further transistors having a terminal common with the common terminal of said first stage, and means for driving said pair of further transistors.

13. The combination in accordance with claim 9, wherein said input circuit includes a potentiometer, said potentiometer having a first terminal connected by D.C. lead to said common terminal and a second terminal connected to said point of D.C. voltage.

14. A signal translating system, comprising a sequence of N-P-N junction transistor units and a sequence of P-N-P junction transistor units, corresponding units of each sequence being a complementary pair of equal size and the units in succeeding sequences being of progressively greater sizes, each transistor unit having an emitter, a base and a collector, the emitters of each pair of units having a common connection to the bases of the larger next following pair of units in the sequences, and the emitters of the largest units having a common output connection, a four-unit bridge of P-N junction rectifiers having N-type terminals of one pair of rectifiers connected to the collectors of the N-P-N sequence of transistor units, said bridge having P-type terminals of another pair of its rectifiers connected to the collectors of the P-N-P sequence of transistor units, wherein the collectors of said N-P-N units and the N-type terminals of one pair of the bridge rectifiers are of an integral N-type semiconductor body, and wherein the collectors of said P-N-P transistor units and the P-type terminals of the other pair of bridge rectifiers are of an integral P-type semiconductor body.

15. An amplifier, including two complementary sequences of junction transistor units, with one unit of each sequence being paired with a corresponding unit of the other sequence and said paired unit comprising cascaded stages, each unit having an emitter, a base and a collector, the emitters of each preceding stage in the cascaded stages having a common connection to the bases of the next following stage, an input circuit and an output circuit connected in series, said input circuit having a common connection to the bases of the first pair of units and the output circuit having a common connection to the output pair of units, wherein each sequence of transistor units includes a unitary body of semiconductor material, said bodies being of opposite conductivity types, and wherein the respective bases are of a subdivided layer of opposite conductivity type having respective rectifying junctions to said bodies.

References Cited in the file of this patent

UNITED STATES PATENTS

| | | |
|---|---|---|
| 2,663,830 | Oliver | Dec. 22, 1953 |
| 2,666,818 | Shockley | Jan. 19, 1954 |
| 2,667,607 | Robinson | Jan. 26, 1954 |
| 2,689,930 | Hall | Sept. 21, 1954 |
| 2,721,965 | Hall | Oct. 25, 1955 |
| 2,751,550 | Chase | June 19, 1956 |
| 2,762,875 | Fischer | Sept. 11, 1956 |
| 2,791,644 | Sziklai | May 7, 1957 |